(12) United States Patent
Oh et al.

(10) Patent No.: US 9,570,664 B2
(45) Date of Patent: Feb. 14, 2017

(54) LIGHT EMITTING DEVICE PACKAGE, BACKLIGHT UNIT, LIGHTING DEVICE AND ITS MANUFACTURING METHOD

(71) Applicant: LUMENS CO., LTD., Yongin-si, Gyeonggi-do (KR)

(72) Inventors: Seunghyun Oh, Gwangju-Si (KR); Seunghoon Lee, Yongin-Si (KR); Tehong Nam, Hwaseong-Si (KR); Kangmin Han, Suwon-Si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/179,952

(22) Filed: Jun. 10, 2016

(65) Prior Publication Data
US 2016/0284960 A1    Sep. 29, 2016

Related U.S. Application Data

(63) Continuation of application No. 14/434,551, filed as application No. PCT/KR2014/011211 on Nov. 20, 2014, now Pat. No. 9,397,278.

(30) Foreign Application Priority Data

Mar. 5, 2014 (KR) .......................... 10-2014-0026054

(51) Int. Cl.
*H01L 33/62* (2010.01)
*H01L 33/48* (2010.01)
(Continued)

(52) U.S. Cl.
CPC ............... *H01L 33/62* (2013.01); *G02B 6/009* (2013.01); *G02B 6/0073* (2013.01);
(Continued)

(58) Field of Classification Search
CPC ........ H01L 33/62; H01L 33/486; H01L 33/54; H01L 33/60; G02B 6/0073; G02B 6/009
See application file for complete search history.

(56) References Cited

U.S. PATENT DOCUMENTS 6,333,522 B1* 12/2001 Inoue ..................... H01L 33/32
257/81
6,828,170 B2* 12/2004 Roberts ............. H01L 23/49562
257/E23.044
(Continued)

FOREIGN PATENT DOCUMENTS

JP        07-263754 A      10/1995
JP        2002-057373      2/2002
(Continued)

OTHER PUBLICATIONS

Japanese Office Action mailed Apr. 26, 2016 in Japanese Patent Application No. 2016-506271, 2 pgs.
(Continued)

*Primary Examiner* — Mary Ellen Bowman
(74) *Attorney, Agent, or Firm* — Ichthus International Law, PLLC

(57) ABSTRACT

Provided are a light emitting device package, a backlight unit, a lighting device and its manufacturing method. The light emitting device package may include a flip chip type light emitting device having a first pad and a second pad, a lead frame that includes a first electrode disposed at one side of an electrode separation space, and a second electrode disposed at the other side of the electrode separation space, and on which the light emitting device is mounted, a first bonding medium formed between the first pad of the light emitting device and the first electrode of the lead frame to electrically connect the first pad and the first electrode, and a second bonding medium formed between the second pad of the light emitting device and the second electrode of the (Continued)

lead frame to electrically connect the second pad and the second electrode, wherein at least one first accommodating cup capable of accommodating the first bonding medium is formed in the first electrode of the lead frame, wherein at least one second accommodating cup capable of accommodating the second bonding medium is formed in the second electrode of the lead frame, and wherein at least one air discharge path is formed on each of the first and second accommodating cups.

10 Claims, 13 Drawing Sheets

(51) Int. Cl.
  *F21V 8/00* (2006.01)
  *H01L 33/54* (2010.01)
  *H01L 33/60* (2010.01)

(52) U.S. Cl.
  CPC ............ *H01L 33/486* (2013.01); *H01L 33/54* (2013.01); *H01L 33/60* (2013.01); *H01L 2224/81385* (2013.01); *H01L 2224/83385* (2013.01); *H01L 2933/0066* (2013.01)

(56) References Cited

U.S. PATENT DOCUMENTS

| | | | |
|---|---|---|---|
| 2010/0079050 A1* | 4/2010 | Kamamori | ............... H01L 33/62 313/113 |
| 2014/0038323 A1* | 2/2014 | Tsang | .................... H01L 33/642 438/26 |
| 2014/0327024 A1* | 11/2014 | Ishihara | ................. H01L 24/97 257/98 |

FOREIGN PATENT DOCUMENTS

| | | |
|---|---|---|
| JP | 2003-101121 | 4/2003 |
| JP | 2005-174998 | 6/2005 |
| KR | 1020110100933 | 9/2011 |
| KR | 1020130051206 | 5/2013 |

OTHER PUBLICATIONS

Korean Office Action dated May 26, 2014 in Korean Patent Application No. 10-2014-0026054, 5 pgs.

* cited by examiner

LIGHT EMITTING DEVICE PACKAGE, BACKLIGHT UNIT, LIGHTING DEVICE AND ITS MANUFACTURING METHOD

CROSS-REFERENCE TO RELATED APPLICATION(S)

This application is a Continuation of U.S. application Ser. No. 14/434,551, filed on Apr. 9, 2015, which is the National Entry of the International Application No. PCT/KR2014/011211, filed Nov. 20, 2014, claiming priority to Korean Patent Application Nos. 10-2014-0026054, filed on Mar. 5, 2014, the entire contents of which are incorporated herein by reference in their entirety.

TECHNICAL FIELD

The present invention relates to a light emitting device package, a backlight unit, a lighting device and its manufacturing method and, more particularly, to a light emitting device package usable as a display or lighting device, a backlight unit, a lighting device and its manufacturing method.

BACKGROUND ART

A light emitting diode (LED) refers to a sort of semiconductor device capable of displaying light of different colors by forming a PN diode of a compound semiconductor as a light source. The LED has advantages of long life, small size and weight, and low-voltage operation. Furthermore, the LED is resistant against impact and vibration, does not need a warm-up time and complex driving, can be packaged after being mounted on a substrate or lead frame in different forms, and thus may be modularized for various purposes to be applied to a backlight unit or various lighting devices.

DETAILED DESCRIPTION OF THE INVENTION

Technical Problem

However, in a conventional light emitting device package, when solder paste is coated on a substrate, if the amount of the coated solder paste is excessively small, the bonding strength between the substrate and a light emitting device may be low and thus shorts may be caused. Otherwise, if the amount of the coated solder paste is excessively large, when the light emitting device is mounted, the solder paste may be pressed by the light emitting device and spread over an electrode separation line along the substrate, and thus shorts may be caused.

Furthermore, in the conventional light emitting device package, since the light emitting device contacts and is hardened on the solder paste which is in a fluidic state, an light emitting axis of the light emitting device may be tilted or dislocated and thus optical performance may be reduced.

Besides, in the conventional light emitting device package, air remaining between the light emitting device and the solder paste may cause air bubbles and thus physical and electrical shorts or damages may be easily caused.

The present invention provides a light emitting device package capable of improving bonding properties and preventing shorts by forming accommodating cups capable of accommodating solder paste in a substrate, accurately aligning an light emitting axis by mounting a light emitting device to directly contact the substrate, and preventing generation of air bubbles in bonding media by easily discharging air inside the accommodating cups to outside using air discharge paths, a backlight unit, a lighting device and its manufacturing method. However, the above technical problem is merely exemplary and the scope of the present invention is not limited thereto.

Technical Solution

According to an aspect of the present invention, there is provided a light emitting device package including a flip chip type light emitting device having a first pad and a second pad, a lead frame that includes a first electrode formed at a side of an electrode separation space, and a second electrode formed at another side of the electrode separation space, and on which the light emitting device is mounted, a first bonding medium formed between the first pad of the light emitting device and the first electrode of the lead frame to electrically connect the first pad and the first electrode, and a second bonding medium formed between the second pad of the light emitting device and the second electrode of the lead frame to electrically connect the second pad and the second electrode, wherein at least one first accommodating cup capable of accommodating the first bonding medium is formed in the first electrode of the lead frame, wherein at least one second accommodating cup capable of accommodating the second bonding medium is formed in the second electrode of the lead frame, and wherein at least one air discharge path is formed on each of the first and second accommodating cups to easily discharge air inside the first and second accommodating cups to outside due to the first and second bonding media pressed inside the first and second accommodating cups when the light emitting device is mounted on the lead frame.

The first and second accommodating cups may be located within a chip footprint area of the light emitting device or pad footprint areas of the first and second pads, and the air discharge path may extend from inside the chip footprint area or the pad footprint areas to outside the chip footprint area or the pad footprint areas.

The air discharge path may be a groove connected to the first accommodating cup and/or the second accommodating cup and having an open top surface, and may be selected from the group consisting of a rectangular groove having a rectangular cross section, an inclined groove having an inclined surface, a polygonal groove having a polygonal cross section, and a round groove having a partially round cross section.

A step may be formed on the air discharge path to prevent discharge of the first or second bonding medium along the air discharge path.

An air vent width of the air discharge path may be greater than a particle size of the first or second bonding medium to allow partial discharge of the first or second bonding medium along the air discharge path.

Each of the first and second accommodating cups may have an inclined bottom surface or a bottom protrusion to guide the first and second bonding media toward the air discharge path.

The first and second bonding media may be formed of solder paste coated or dispensed on the first and second accommodating cups, respectively, a plurality of first accommodating cups may be located in parallel along a length or width direction of the first pad, and the light emitting device package may further include a reflective encapsulant filled in the electrode separation space to form an electrode separation wall and surrounding side surfaces of the light emitting device to form a reflective cup. According to another aspect of the present invention, there is provided a backlight unit including a flip chip type light emitting device having a first pad and a second pad, a lead frame that includes a first electrode formed at a side of an electrode separation space, and a second electrode formed at another side of the electrode separation space, and on which the light emitting device is mounted, a first bonding medium formed between the first pad of the light emitting device and the first electrode of the lead frame to electrically connect the first pad and the first electrode, a second bonding medium formed between the second pad of the light emitting device and the second electrode of the lead frame to electrically connect the second pad and the second electrode, and a light guide plate formed on an optical path of the light emitting device, wherein at least one first accommodating cup capable of accommodating the first bonding medium is formed in the first electrode of the lead frame, wherein at least one second accommodating cup capable of accommodating the second bonding medium is formed in the second electrode of the lead frame, and wherein at least one air discharge path is formed on each of the first and second accommodating cups to easily discharge air inside the first and second accommodating cups to outside due to the first and second bonding media pressed inside the first and second accommodating cups when the light emitting device is mounted on the lead frame.

According to another aspect of the present invention, there is provided a lighting device including a flip chip type light emitting device having a first pad and a second pad, a lead frame including a first electrode formed at a side of an electrode separation space, and a second electrode formed at another side of electrode separation space, a first bonding medium formed between the first pad of the light emitting device and the first electrode of the lead frame to electrically connect the first pad and the first electrode, and a second bonding medium formed between the second pad of the light emitting device and the second electrode of the lead frame to electrically connect the second pad and the second electrode, wherein at least one first accommodating cup capable of accommodating the first bonding medium is formed in the first electrode of the lead frame, wherein at least one second accommodating cup capable of accommodating the second bonding medium is formed in the second electrode of the lead frame, and wherein at least one air discharge path is formed on each of the first and second accommodating cups to easily discharge air inside the first and second accommodating cups to outside due to the first and second bonding media pressed inside the first and second accommodating cups when the light emitting device is mounted on the lead frame.

According to another aspect of the present invention, there is provided a manufacturing method of a light emitting device package, the method including preparing a lead frame including a first electrode formed at a side of an electrode separation space, a second electrode formed at another side of the electrode separation space, a first accommodating cup formed in the first electrode, a second accommodating cup formed in the second electrode, and at least one air discharge path formed on each of the first and second accommodating cups, coating or dispensing a first bonding medium on the first accommodating cup and coating or dispensing a second bonding medium on the second accommodating cup, mounting a light emitting device on the lead frame and discharging air inside the first and second accommodating cups to outside using the air discharge path due to the first and second bonding media pressed inside the first and second accommodating cups, and reflowing the first and second bonding media.

Advantageous Effects

According to some embodiments of the present invention, bonding properties may be improved by forming accommodating cups capable of accommodating solder paste in a substrate to increase a bonding surface area, shorts may be prevented by guiding the solder paste away from an electrode separation line, an light emitting axis may be accurately aligned by mounting a light emitting device to allow two pads of the light emitting device to directly contact the substrate, chip lift may be prevented by firmly bonding the light emitting device with bonding media in the accommodating cups, and physical and electrical bonding properties between components may be improved by preventing generation of air bubbles in the bonding media using air discharge paths, the strength and durability of products may be increased, errors of the products may be prevented, and thus productivity may be greatly increased. However, the above effects are merely exemplary and the scope of the present invention is not limited thereto.

BEST MODE

Figure 1:
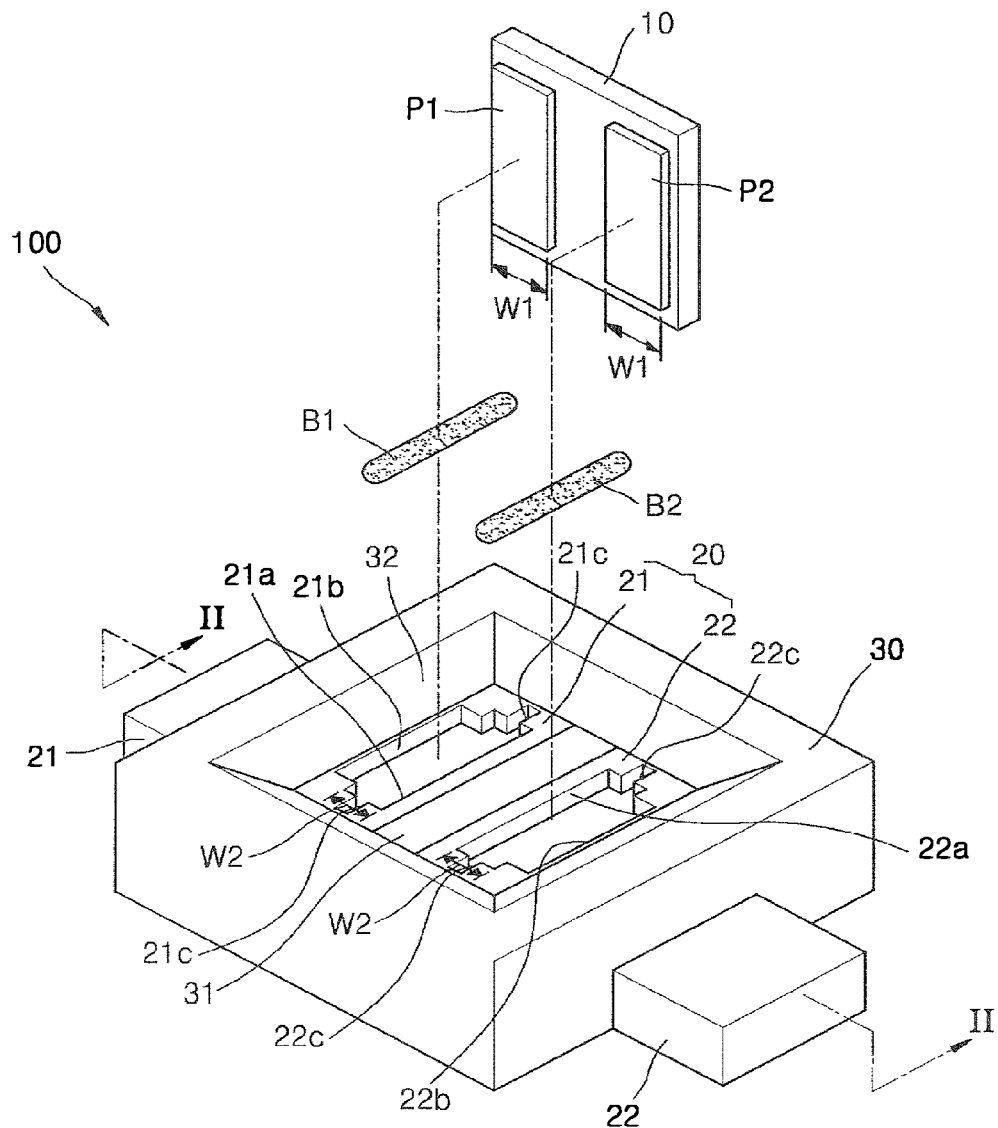
FIG. 1 is an exploded perspective view of a light emitting device package according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity.

It will also be understood that when an element such as layer, region or substrate is referred to as being "on", "connected to", "stacked on" or "coupled to" other element, it may be directly "on", "connected to", "stacked on" or "coupled to" the other element, or intervening element may also be present therebetween. On the other hand, when an element is referred to as being "directly on", "directly connected to" or "directly coupled to" other element, it should be construed that no intervening elements exist therebetween. Like reference numerals in the drawings denote like elements. As used herein, the term "and/or" refers to one of or a combination of at least two listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms such as "upper", "above", "lower", or "under" may be used herein to describe the relationship between one element and the other element(s) as shown in the drawings. It should be understood that the relative terms are intended to include other directions in addition to the directions shown in the drawings. For example, when an element is turned upside down in the drawings, elements that are depicted to be disposed on an upper surface of the other element will be disposed on a lower surface of the other element. Therefore, the illustrative term "upper" may mean "upper" or "lower", depending on a particular direction in the drawings. When an element is directed to another direction (rotated at a right angle with reference to other direction), descriptions in the specification will be construed accordingly.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
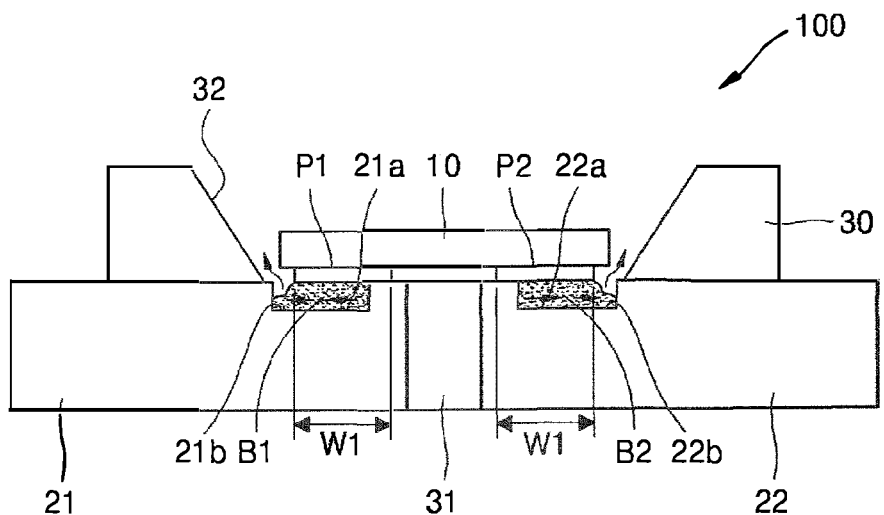
FIG. 2 is a cross-sectional view taken along line II-II of the light emitting device package of FIG. 1.
Figure 3:
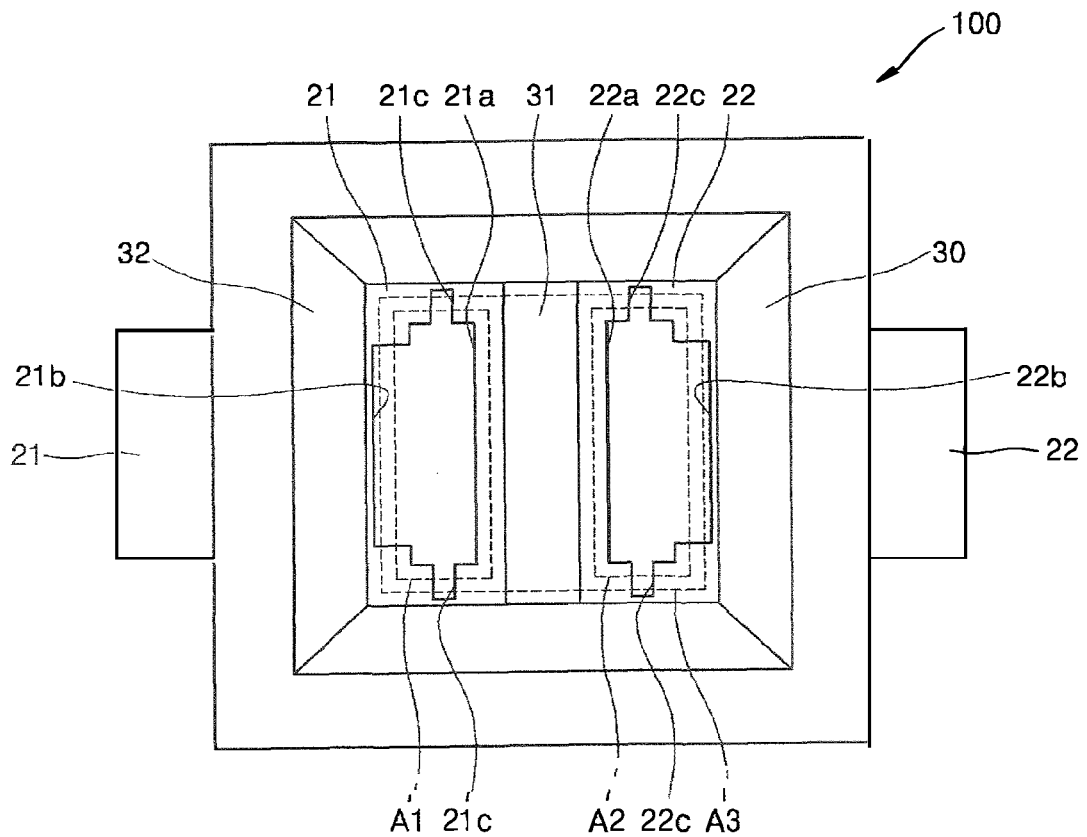
FIG. 3 is a plan view of air discharge paths of the light emitting device package of FIG. 1.
Figure 4:
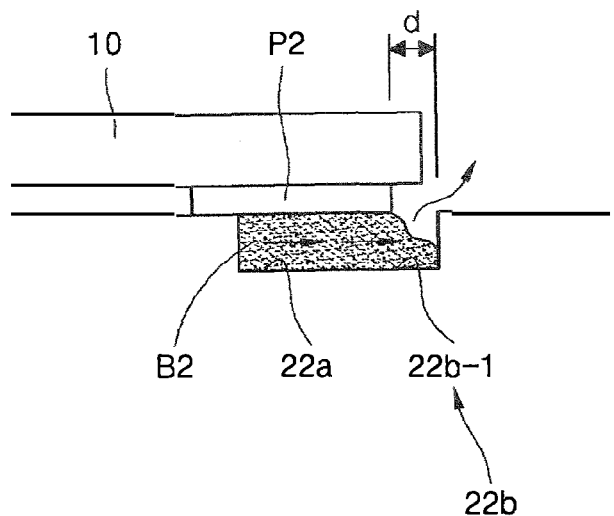
FIG. 4 is a magnified cross-sectional view of the air discharge path of the light emitting device package of FIG. 2.

FIG. 1 is an exploded perspective view of a light emitting device package 100 according to some embodiments of the present invention, FIG. 2 is a cross-sectional view taken along line II-II of the light emitting device package 100 of FIG. 1, FIG. 3 is a plan view of air discharge paths 21b, 21c, 22b, and 22c of the light emitting device package 100 of FIG. 1, and FIG. 4 is an enlarged cross-sectional view of the air discharge path 22b of the light emitting device package 100 of FIG. 2.

Initially, as illustrated in FIGS. 1 to 4, the light emitting device package 100 according to some embodiments of the present invention may include a light emitting device 10, a lead frame 20, a first bonding medium B1, and a second bonding medium B2.

Here, the light emitting device 10 may be a flip chip type light emitting diode (LED) having a first pad P1 and a second pad P2.

The light emitting device 10 may be formed of a semiconductor as illustrated in FIG. 1. For example, the light emitting device 10 may be an LED that emits blue, green, red, and yellow light, an LED that emits ultraviolet light, or an LED that emits infrared light, which is formed of a nitride semiconductor.

Furthermore, the light emitting device 10 may be formed by, for example, epitaxially growing a nitride semiconductor such as InN, AlN, InGaN, AlGaN or InGaAlN on a growth substrate such as a sapphire or silicon carbide (SiC) substrate using a vapor deposition method such as metal organic chemical vapor deposition (MOCVD). Alternatively, the light emitting device 30 may be formed by using a semiconductor such as ZnO, ZnS, ZnSe, SiC, GaP, GaAlAs or AlInGaP other than the nitride semiconductor. These semiconductors may include a stacked structure in which an n-type semiconductor layer, a light-emitting layer and a p-type semiconductor layer are sequentially provided. The light-emitting layer (active layer) may include a staked semiconductor having a multi-quantum well structure or a single quantum well structure, or a staked semiconductor having a double heterostructure. In addition, the light emitting device 10 may select one of an arbitrary wavelength based on the use thereof, e.g., display or lighting.

Here, the growth substrate may use an insulating, conductive or semiconductor substrate as necessary. For example, the growth substrate may be a sapphire, SiC, Si, $MgAl_2O_4$, MgO, $LiAlO_2$, $LiGaO_2$, or GaN substrate. For epitaxial growth of a GaN material, a GaN substrate which includes the same material as the GaN material may be appropriate, but it is problematic that the manufacturing cost for GaN is high due to difficulties in manufacturing.

A sapphire or silicon carbide (SiC) substrate is often used as a heterogeneous substrate, and the sapphire substrate is more commonly used than the SiC substrate which is high-priced. When the substrate other than the GaN substrate is used, defects such as dislocations are increased due to the differences in lattice constants between the substrate material and the thin film material. In addition, when temperature varies, warpage occurs due to the differences in thermal expansion coefficients between the substrate material and the thin film material, thereby causing cracks in the thin film. This problem can be reduced by using a buffer layer between the substrate and the GaN-based light-emitting laminate.

The growth substrate may be completely or partially eliminated or patterned in a chip manufacturing procedure before or after the growth of an LED structure to improve optical or electrical properties of an LED chip.

For example, a sapphire substrate may be separated by projecting a laser beam through the substrate onto the interface with the semiconductor layer, and a silicon (Si) or silicon carbide (SiC) substrate may be eliminated by a polishing or etching method.

In some cases, a supporting substrate is used when the growth substrate is eliminated. The supporting substrate may be formed by bonding reflective metal or inserting a reflection structure into a bonding layer on the original growth substrate to improve light efficiency of the LED chip.

Furthermore, patterning of the growth substrate improves light extraction efficiency by making principal surfaces (top, or top and bottom surfaces) or side surfaces of the substrate uneven or inclined before or after growing the LED structure. The patterns may have a size selected from a range of 5 nm to 500 µm and include regular or irregular patterns as long as light extraction efficiency is improved. The patterns may have a variety of shapes such as poles, mountains, hemispheres and polygons.

The sapphire substrate is a crystal body having Hexa-Rhombo (Hexa-Rhombo R3c) symmetry. The sapphire has a lattice constant of 13.001 Å in c-axis orientation, and a lattice constant of 4.758 Å in a-axis orientation; and has a C-plane, A-plane and R-plane. Here, the C-plane of this sapphire substrate allows a nitride thin film to be grown thereupon relatively easily and is stable even at high temperatures, thus it is predominantly utilized as a substrate for nitride growth.

Another example of the growth substrate is a Si substrate. The Si substrate is appropriate for a large diameter substrate and relatively cheap, thus advantageous for mass production.

Since the silicon (Si) substrate absorbs light generated by a GaN-based semiconductor and thus external quantum efficiency of the light emitting device decreases, the silicon substrate is eliminated if necessary and a supporting substrate including a reflection layer and formed of Si, Ge, SiAl, ceramic or metal is additionally formed and used.

When a GaN thin film is grown on a non-GaN substrate such as the Si substrate, the density of dislocation may be increased due to the differences in lattice constants between the substrate material and the thin film material, and cracks and warpage may occur due to the differences in thermal expansion coefficients therebetween. A buffer layer may be disposed between the growth substrate and the light-emitting laminate to prevent generation of dislocations and cracks of the light-emitting laminate. The buffer layer also decreases wavelength dispersion of wafers by controlling the degrees of warpage of the substrate when the active layer grows.

Although not shown in FIG. 1, the light emitting device 10 may be a flip chip having a signal transfer medium such as bumps or solder in addition to the first and second pads P1 and P2. Alternatively, the light emitting device 10 may be a light emitting device using bonding wire as terminals, or partially using bonding wire only as a first terminal or a second terminal, a horizontal or vertical light emitting device, or the like.

The first and second pads P1 and P2 may be modified into various shapes other than the rectangular shape illustrated in FIG. 1. For example, the first and second pads P1 and P2 may have a finger structure including an arm and a plurality of fingers disposed on the arm.

A single light emitting device 10 may be mounted on the lead frame 20 as illustrated in FIG. 1, or a plurality of light emitting devices 10 may be mounted on the lead frame 20.

The lead frame 20 may be a sort of substrate including a first electrode 21 disposed at one side of an electrode separation space and a second electrode 22 disposed at the other side of the electrode separation space.

The lead frame 20 may be made of an insulating or conductive material having an appropriate mechanical strength to support or accommodate the light emitting device 10.

For example, the lead frame 20 may be formed of aluminum (Al), copper (Cu), zinc (Zn), tin (Sn), lead (Pb), gold (Au), silver (Ag) or the like capable of being insulated, and may be a plate-type lead frame that has holes bored therethrough or is bent.

Other than the above, the lead frame 20 may be replaced with a printed circuit board (PCB) having multiple sheets of epoxy-based resin stacked. Alternatively, the lead frame 20 may be a thin flexible printed circuit board (FPCB).

Alternatively, the lead frame 20 may be replaced with a synthetic resin substrate formed of resin, glass epoxy, or the like, or with a ceramic substrate in consideration of thermal conductivity.

Furthermore, the lead frame 20 may partially or entirely include one or more materials selected from the group consisting of epoxy mold compound (EMC), polyimide (PI), ceramic, graphene, synthetic glass fiber, and mixtures thereof to improve processability.

The first bonding medium B1 may be a bonding element disposed between the first pad P1 of the light emitting device 10 and the first electrode 21 of the lead frame 20 such that the first pad P1 and the first electrode 21 are electrically connected.

Furthermore, the second bonding medium B2 may be a bonding element disposed between the second pad P2 of the light emitting device 10 and the second electrode 22 of the lead frame 20 such that the second pad P2 and the second electrode 22 are electrically connected.

Here, the first and second bonding media B1 and B2 may be solder paste or solder cream that is coated or dispensed in a first accommodating cup 21a and a second accommodating cup 22a, respectively.

In addition, the first and second bonding media B1 and B2 may be a conductive bonding material, e.g., solder, that is fluidic when bonded but is hardened when cooled, heated, or dried.

In the light emitting device package 100 according to some embodiments of the present invention, at least one first accommodating cup 21a capable of accommodating the first bonding medium B1 may be formed in the first electrode 21 of the lead frame 20, and at least one second accommodating cup 22a capable of accommodating the second bonding medium B2 may be formed in the second electrode 22 of the lead frame 20.

Here, as illustrated in FIG. 2, an opening width W2 or a length of the first accommodating cup 21a may be smaller than a width W1 or a length of the first pad P1, and an opening width W2 or a length of the second accommodating cup 22a may be smaller than a width W1 or a length of the second pad P2 in such a manner that part of the first pad P1 of the light emitting device 10 directly contacts the first electrode 21 of the lead frame 20, and part of the second pad P2 of the light emitting device 10 directly contacts the second electrode 22 of the lead frame 20.

Accordingly, since part of the first pad P1 of the light emitting device 10 directly contacts the first electrode 21 of the lead frame 20, and part of the second pad P2 of the light emitting device 10 directly contacts the second electrode 22 of the lead frame 20, when the light emitting device 10 is mounted, the light emitting device 10 may not be tilted or dislocated due to direct contact between the first and second pads P1 and P2 of the light emitting device 10 and the lead frame 20, and thus a light emitting axis may be accurately aligned.

As illustrated in FIG. 3, the first and second accommodating cups 21a and 22a may be located within pad footprint areas A1 and A2 of the first and second pads P1 and P2, respectively.

As illustrated in FIGS. 1 to 4, at least one of the air discharge paths 21b and 21c and at least one of the air discharge paths 22b and 22c may be formed in the first and second accommodating cups 21a and 22a, respectively, to easily discharge the air inside the first and second accommodating cups 21a and 22a to the outside due to the first and second bonding media B1 and B2 that are depressed inside the first and second accommodating cups 21a and 22a when the light emitting device 10 is mounted on the lead frame 20.

Here, as illustrated in FIG. 3, the first and second accommodating cups 21a and 22a may be located within a chip footprint area A3 of the light emitting device 10 or the pad footprint areas A1 and A2 of the first and second pads P1 and P2, and the air discharge paths 21b, 21c, 22b, and 22c may extend from inside of the chip footprint area A3 or the pad footprint areas A1 and A2 to the outside of the chip footprint area A3 or the pad footprint areas A1 and A2 to easily discharge the air inside the first and second accommodating cups 21a and 22a to the outside.

As such, the air inside the first and second accommodating cups 21a and 22a may be discharged to the outside using the air discharge paths 21b, 21c, 22b, and 22c due to the first and second bonding media B1 and B2 that are depressed inside the first and second accommodating cups 21a and 22a after the light emitting device 10 is mounted on the lead frame 20.

Therefore, since generation of air bubbles inside the first and second bonding media B1 and B2 is prevented by the air discharge paths 21b, 21c, 22b, and 22c, physical and electrical bonding properties between components may be improved, the strength and durability of products may be increased, defects of the products may be prevented, and thus productivity may be greatly increased.

As illustrated in FIGS. 1 to 4, the air discharge path 21b may be formed to extend in a first direction away from an electrode separation wall 31 (i.e., a width direction of the first pad P1) relative to the first accommodating cup 21a, and the air discharge path 21c may be formed to extend in a second direction at an angle of 90 degrees to the first direction (i.e., a length direction of the first pad P1) relative to the first accommodating cup 21a.

Alternatively, the air discharge path 21c may extend in various directions, e.g., radially away from the electrode separation wall 31.

The first and second accommodating cups 21a and 22a are located in the chip footprint area A3 of the light emitting device 10.

Here, for example, the pad footprint area A1 of the first pad P1 means an area of the lead frame 20 on which the first pad P1 is projected in a plan view thereof, and may refer to a base area occupied by the first pad P1 on the lead frame 20.

As illustrated in FIG. 4, an air vent width d of the air discharge path 22b may be greater than at least a particle size of the first or second bonding medium B1 or B2 to allow partial discharge of the first or second bonding medium B1 or B2 along the air discharge path 22b.

Accordingly, although the amount coating or dispensing of the first or second bonding medium B1 or B2 should be accurately controlled to prevent discharge of the first or second bonding medium B1 or B2 through the air discharge path 22b. Since the air vent width d of the air discharge path 22b is greater than the particle size of the first or second bonding medium B1 or B2, the first or second bonding medium B1 or B2 may be partially discharged through the air discharge path 22b and thus the air may be completely discharged.

FIGS. 4 to 11 are enlarged cross-sectional views of the air discharge path 22b of the light emitting device package 100 according to various embodiments of the present invention.

As illustrated in FIGS. 4 to 11, the air discharge path 22b may be a groove having various shapes, that is connected to the first accommodating cup 21a and/or the second accommodating cup 22a and has the top open.

Figure 5:
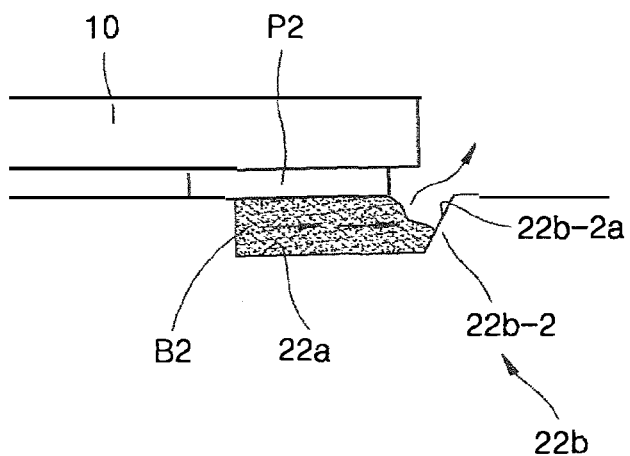
FIGS. 5 to 11 are enlarged cross-sectional views of the air discharge path of the light emitting device package according to various embodiments of the present invention.

Particularly, for example, as illustrated in FIG. 4, the air discharge path 22b may be a rectangular groove 22b-1 having a rectangular cross section to guide the air vertically upward. Alternatively, as illustrated in FIG. 5, the air discharge path 22b may be an inclined groove 22b-2 having an inclined surface 22b-2a to guide the air therealong.

Figure 6:
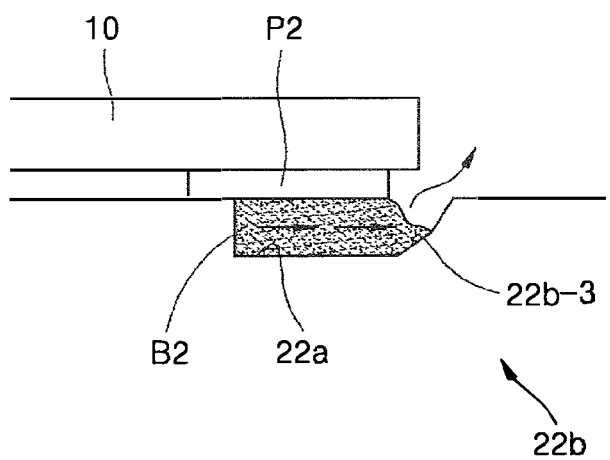
Figure 7:
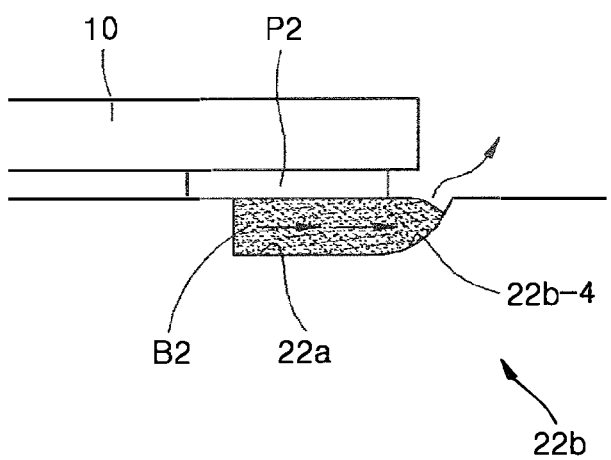

Furthermore, as illustrated in FIG. 6, the air discharge path 22b may be a polygonal groove 22b-3 having a polygonal cross section to guide the air therealong in multiple steps. Besides, as illustrated in FIG. 7, the air discharge path 22b may be a round groove 22b-4 having a partially round cross section to guide the air therealong.

Figure 8:
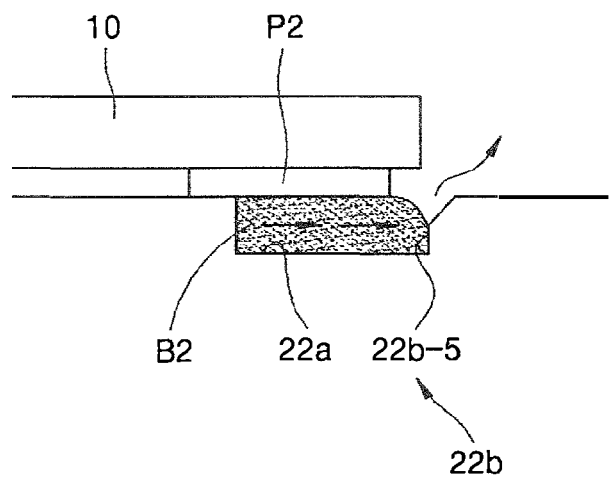

Alternatively, for example, as illustrated in FIG. 8, a protruding step 22b-5 protruding upward or sideward may be formed at the air discharge path 22b to prevent discharge of the first or second bonding medium B1 or B2 through the air discharge path 22b.

Figure 9:
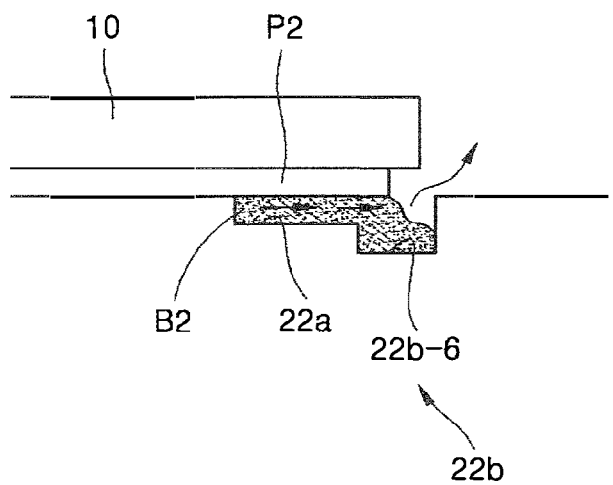

In addition, as illustrated in FIG. 9, a recessed step 22b-6 recessed downward may be formed in the air discharge path 22b to prevent discharge of the first or second bonding medium B1 or B2 through the air discharge path 22b.

Accordingly, the path for discharging air may be optimally guided depending on the viscosity, temperature, or fluidity of the first and second bonding media B1 and B2, surrounding environment, or the amount of coating or dispensing of the first and second bonding media B1 and B2, or the dimension of the first and second accommodating cups 21a and 22a, and the first or second bonding medium B1 or B2 may be prevented from being discharged through the air discharge path 22b.

Here, the air discharge paths 21b, 21c, 22b, and 22c may be equal-shape or different-shape grooves, or may be grooves or passages having various shapes.

Figure 10:
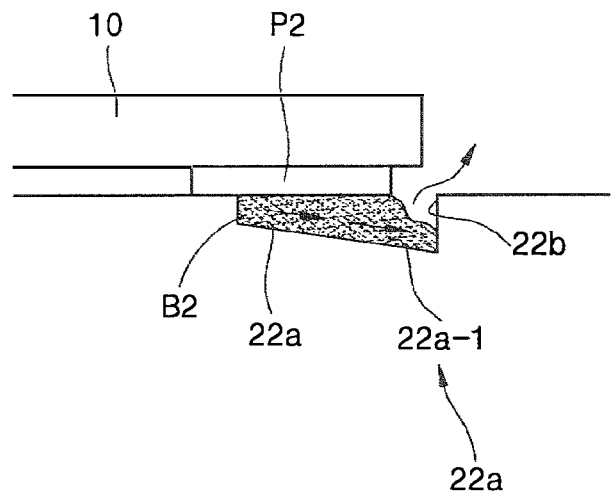

As illustrated in FIG. 10, to make the first and second bonding media B1 and B2 actively flow, the second accommodating cup 22a may have an inclined bottom surface 22a-1 to guide the first and second bonding media B1 and B2 toward the air discharge path 22b.

Figure 11:
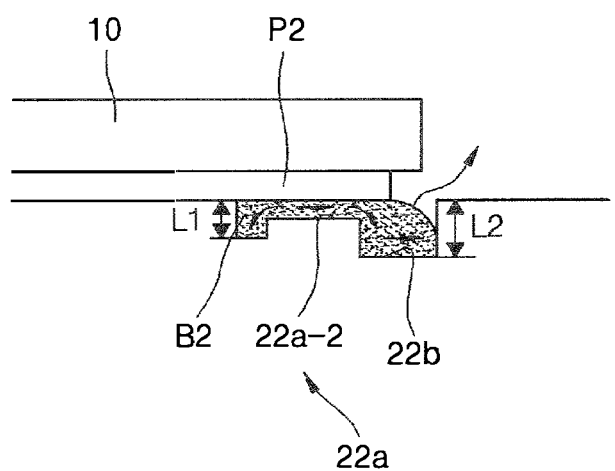

Alternatively, as illustrated in FIG. 11, the second accommodating cup 22a may have a bottom protrusion 22a-2 to guide the first and second bonding media B1 and B2 toward the air discharge path 22b.

Here, a bottom depth L1 near the bottom protrusion 22a-2 away from the air discharge path 22b may be relatively small and a bottom depth L2 near the bottom protrusion 22a-2 close to the air discharge path 22b may be relatively large to guide the first and second bonding media B1 and B2 toward the air discharge path 22b.

Accordingly, as illustrated in FIGS. 10 and 11, when the light emitting device 10 is mounted on the lead frame 20, the first and second bonding media B1 and B2 may be guided toward the air discharge path 22b due to the first and second bonding media B1 and B2 that are depressed inside the first and second accommodating cups 21a and 22a and the above-described inclined bottom surface 22a-1 or the bottom protrusion 22a-2, and then the air may be discharged through the air discharge paths 21b and 22b to the outside of the first and second accommodating cups 21a and 22a due to the first and second bonding media B1 and B2.

Figure 12:
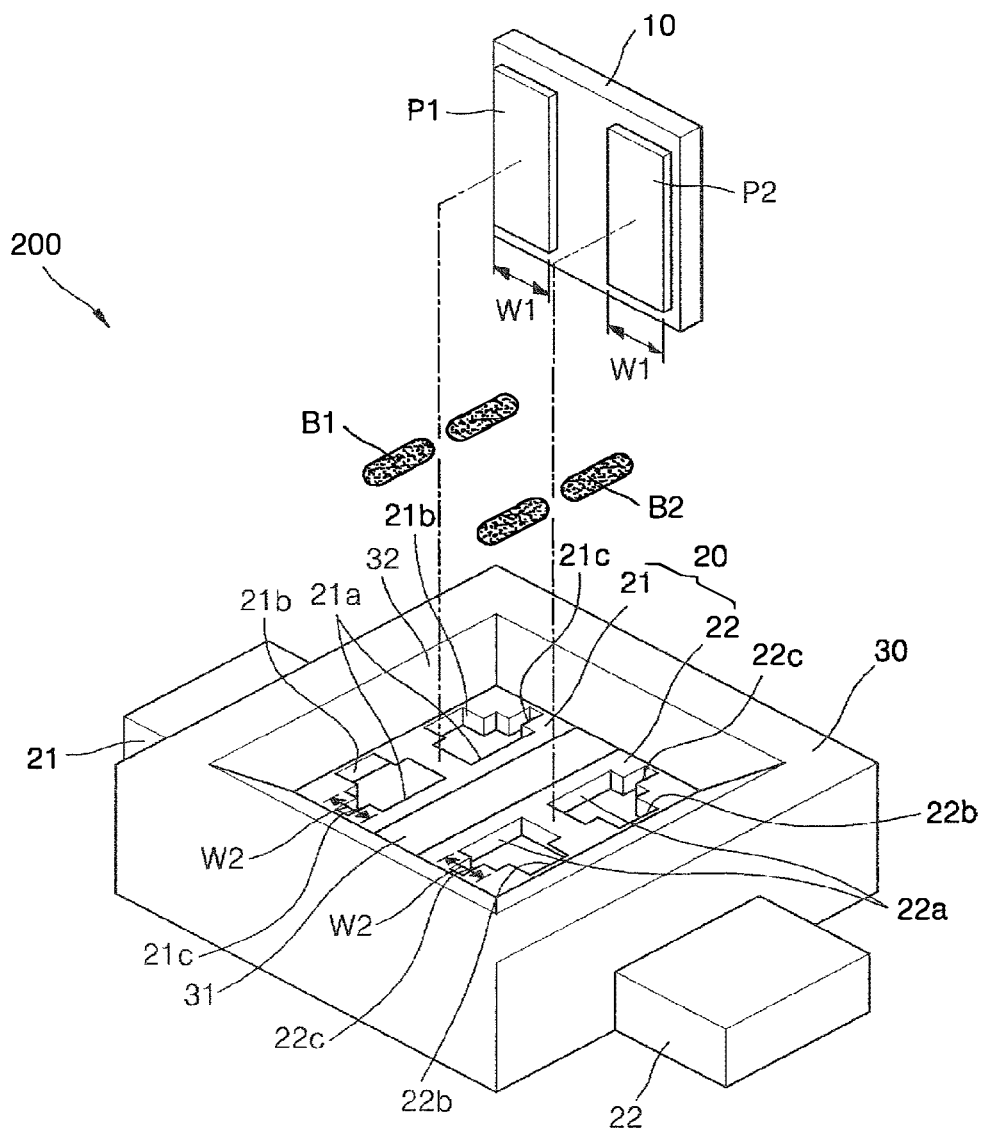
FIG. 12 is an exploded perspective view of a light emitting device package according to some other embodiments of the present invention.
Figure 13:
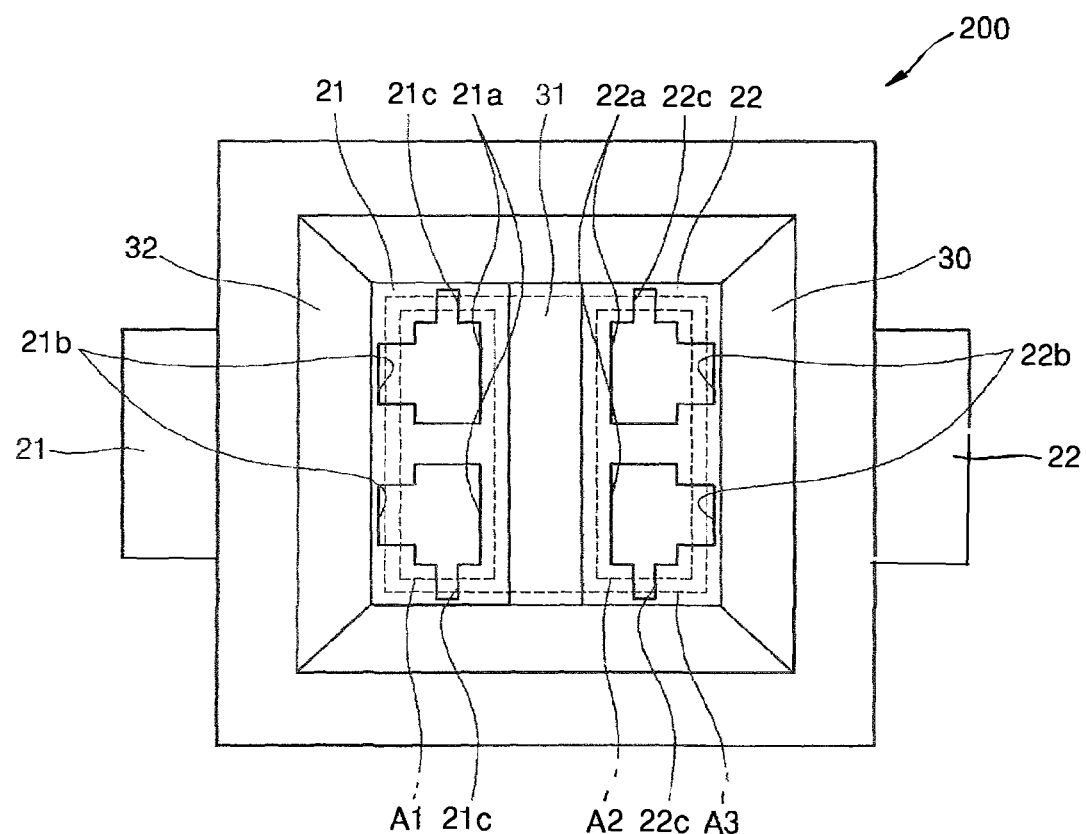
FIG. 13 is a plan view of air discharge paths of the light emitting device package of FIG. 12.

FIG. 12 is an exploded perspective view of a light emitting device package 200 according to some other embodiments of the present invention, and FIG. 13 is a plan view of air discharge paths 21b, 21c, 22b, and 22c of the light emitting device package 200 of FIG. 12.

As illustrated in FIGS. 12 and 13, in the light emitting device package 200 according to some other embodiments of the present invention, two first accommodating cups 21a and 21a and two second accommodating cups 22a and 22a are located in parallel to each other along the length directions of the first and second pads P1 and P2 and thus a total of four accommodating cups 21a, 21a, 22a and 22a may be provided. Here, the number and location of the first and second accommodating cups 21a, 21a, 22a and 22a may vary (e.g., the number thereof may be two, four, or eight), and are not limited to those illustrated in FIGS. 12 and 13.

Furthermore, the light emitting device 10 and the lead frame 20 may directly contact each other in various parts. For example, as described above, the first and second pads P1 and P2 of the light emitting device 10 may directly contact the lead frame 20. Alternatively, although not shown FIGS. 12 and 13, the first and second pads P1 and P2 of the light emitting device 10 may be partially or entirely inserted into the above-described first and second accommodating cups 21a and 22a, and a bottom surface of the light emitting device 10 near the first and second pads P1 and P2 may directly contact the lead frame 20. That is, the light emitting device 10 may be mounted on the lead frame 20 in various manners.

Figure 14:
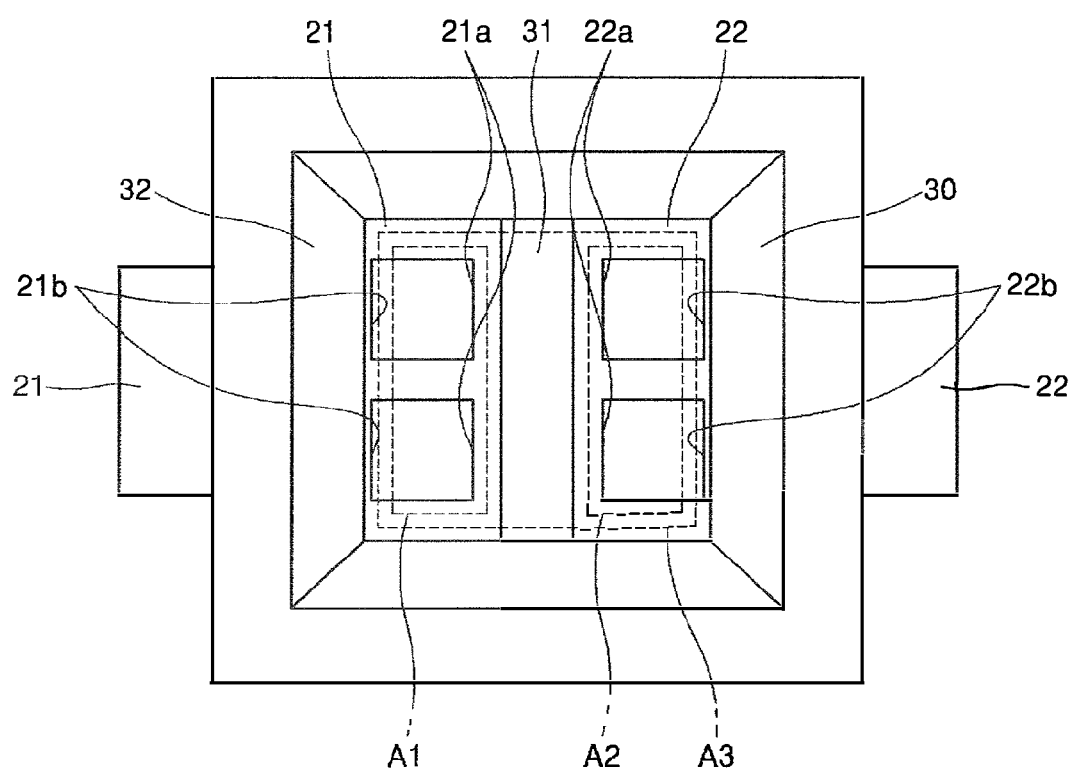
FIG. 14 is a plan view of air discharge paths of the light emitting device package according to some other embodiments of the present invention.
Figure 15:
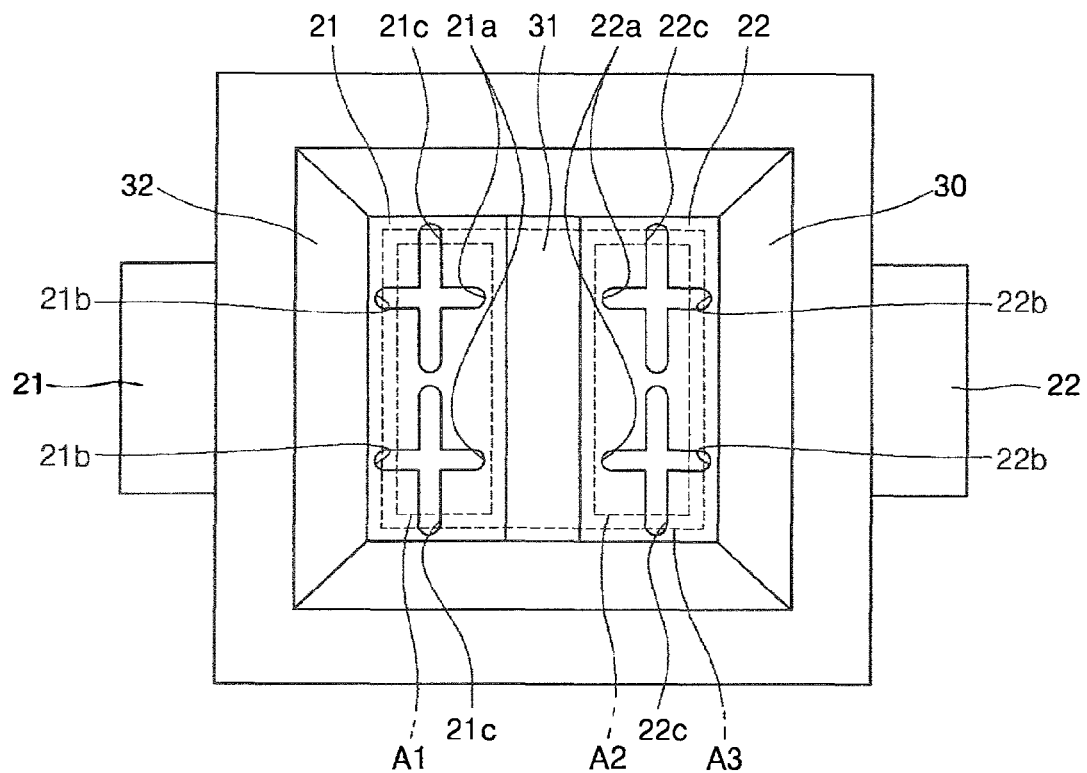
FIG. 15 is a plan view of air discharge paths of the light emitting device package according to some other embodiments of the present invention.

FIG. 14 is a plan view of air discharge paths 21b and 22b of the light emitting device package according to some other embodiments of the present invention, and FIG. 15 is a plan view of air discharge paths 21b and 22b of the light emitting device package according to some other embodiments of the present invention.

As illustrated in FIG. 14, for example, one air discharge path 21b and one air discharge path 22b having the same width as and connected to each first accommodating cup 21a and each second accommodating cup 22a may be formed in directions away from the electrode separation wall 31. Alternatively, as illustrated in FIG. 15, the first and second accommodating cups 21a and 22a and the air discharge paths 21b, 21c, 22b, and 22c may be formed in cross shapes. In addition, the first and second accommodating cups 21a and 22a and the air discharge paths 21b, 21c, 22b, and 22c may be formed in various shapes, e.g., triangle, oval, polygon and slash.

As illustrated in FIGS. 1 to 15, the light emitting device packages 100 and 200 according to the present invention may further include a reflective encapsulant 30 that fills the electrode separation space to form the electrode separation wall 31 and that forms a reflective cup 32 surrounding side surfaces of the light emitting device 10, and a filler 40 that filled the inside of the reflective cup 32.

Here, the reflective encapsulant 30 may be molded integrally with the electrode separation wall 31 and the reflective cup 32.

Other than the above, the reflective encapsulant 30 may include at least one material selected from the group consisting of epoxy resin composition, silicone resin composition, modified epoxy resin composition, modified silicone resin composition, polyimide resin composition, modified polyimide resin composition, polyphthalamide (PPA), polycarbonate resin, polyphenylene sulfide (PPS), liquid crystal polymer (LCP), acrylonitrile butadiene styrene (ABS) resin, phenol resin, acrylic resin, polybutylene terephthalate (PBT) resin, a Bragg reflection layer, air gap, a total reflection layer, a metal layer, and combinations thereof.

Furthermore, the reflective encapsulant 30 may include at least one material selected from the group consisting of epoxy mold compound (EMC) that includes a reflective material, white silicone that includes a reflective material, Photoimageable Solder Resist (PSR), and combinations thereof.

Furthermore, more particularly, the reflective encapsulant 30 may include at least one material selected from the group consisting of epoxy resin composition, silicone resin composition, modified epoxy resin composition such as silicone-modified epoxy resin, modified silicone resin composition such as epoxy-modified silicone resin, polyimide resin composition, modified polyimide resin composition, polyphthalamide (PPA), polycarbonate resin, polyphenylene sulfide (PPS), liquid crystal polymer (LCP), acrylonitrile butadiene styrene (ABS) resin, phenol resin, acrylic resin, polybutylene terephthalate (PBT) resin, or the like.

Furthermore, titanium oxide, silicon dioxide, titanium dioxide, zirconium dioxide, potassium titanate, alumina, aluminum nitride, boron nitride, mullite, chrome, or a light reflective material such as a white-based or metal-based component may be contained in the resin.

Figure 20:
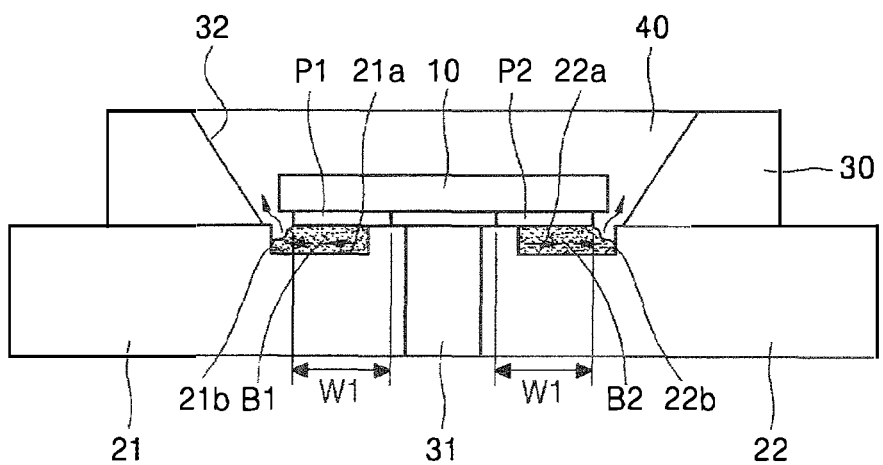

Furthermore, as shown in FIG. 20, the reflective cup 32 may be filled with a filler 40.

Here, the filler 40 may include one or more materials having relatively small and dense particles, and may be selected from the group consisting of silicon, transparent epoxy, phosphor, and combinations thereof.

Other than the above, the filler 40 may be include glass, acrylic resin, epoxy resin, epoxy resin composition, silicone resin composition, modified epoxy resin composition, modified silicone resin composition, polyimide resin composition, modified polyimide resin composition, polyphthalamide (PPA), polycarbonate resin, polyphenylene sulfide (PPS), liquid crystal polymer (LCP), acrylonitrile butadiene styrene (ABS) resin, phenol resin, acrylic resin, polybutylene terephthalate (PBT) resin, or the like.

Furthermore, the filler 40 may include a phosphor.

The compositions of the phosphor should basically comply with stoichiometry, and each element is replaceable with another element of the same group in the periodic table. For example, Sr is replaceable with Ba, Ca or Mg of alkaline earth group (Group II), and Y is replaceable with lanthanum-based Tb, Lu, Sc or Gd. Furthermore, Eu which is an activator is replaceable with Ce, Tb, Pr, Er or Yb based on a desired energy level, and the activator may be used solely or together with a co-activator for property modification.

Furthermore, the phosphor may include a material such as quantum dots (QDs). The phosphor may include the above-described oxide-based, nitride-based, silicate-based, and QD materials solely or in combination thereof.

The QDs may be composed of cores (3 nm to 10 nm) of CdSe, InP or the like, shells (0.5 nm to 2 nm) of ZnS, ZnSe or the like, and ligands for stabilization of the cores and shells, and display a variety of colors based on sizes thereof.

Furthermore, the phosphor may be coated on the LED chip or the light emitting device by using at least one of spraying, overlaying, and film or ceramic phosphor sheet bonding.

Dispensing or spray coating is commonly used as the spraying method, and the dispensing method includes mechanical methods such as pneumatic, screw and linear type dispensing. A jetting method allows control of a coating amount through small discharge and thus allows control of color coordinates. If the phosphor is coated at a wafer level or on the LED substrate using the spraying scheme, productivity and thickness control may be easily achieved.

The overlaying method directly on the light emitting device or the LED chip may include electrophoresis, screen printing and molding, and these schemes may differ depending on whether side surfaces of the LED chip need to be coated.

Two or more phosphors having different emission wavelengths may be used to control the efficiency of a long-wavelength emission phosphor which absorbs light emitted at short wavelengths, and a distributed Bragg reflector (DBR) (or omnidirectional reflector (ODR)) layer may be inserted between every two layers to minimize wavelength re-absorption and interference of the LED chip and the two or more phosphors.

The phosphor may be formed as a film or ceramic and then bonded on the LED chip or the light emitting device to form a uniform coating layer.

A photoconversion material may be used in a remote manner to provide a difference in light efficiency and light distribution properties. Here, the photoconversion material is used together with a material such as light-transmitting polymer or glass depending on durability and heat resistance thereof.

This phosphor coating technology is a main factor for determining optical properties of the light emitting device 10, and thus research is being conducted on a variety of control technologies related to the thickness of a phosphor coating layer, uniform dispersion of a phosphor, etc. The QDs may also be used for the LED chip or the light emitting device 10 in the same manner as the phosphor, and may be disposed in glass or light-transmitting polymer to perform optical conversion.

Figure 21:
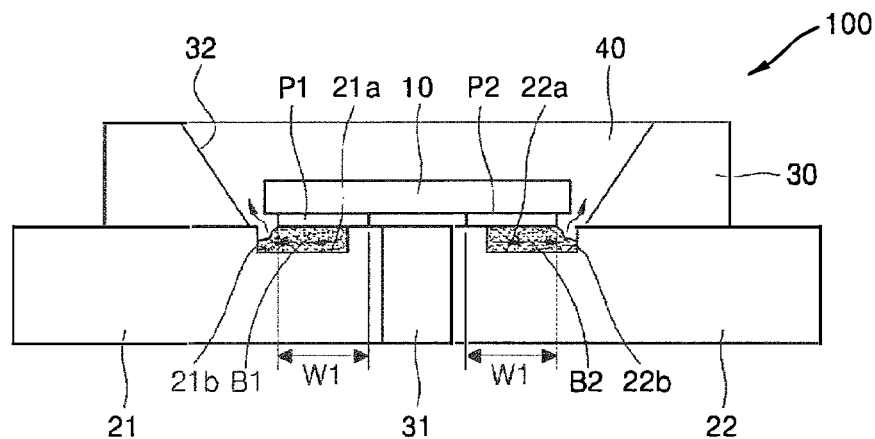
FIG. 21 is a cross-sectional view of a backlight unit according to some embodiments of the present invention.

FIG. 21 is a cross-sectional view of a backlight unit 1000 according to some embodiments of the present invention.

As illustrated in FIG. 21, the backlight unit 1000 according to some embodiments of the present invention may include a flip chip type light emitting device 10 having a first pad P1 and a second pad P2, a lead frame 20 including a first electrode 21 formed at a side of an electrode separation space and a second electrode 22 formed at another side of the electrode separation space, a first bonding medium B1 formed between the first pad P1 of the light emitting device 10 and the first electrode 21 of the lead frame 20 to electrically connect the first pad P1 and the first electrode 21, a second bonding medium B2 formed between the second pad P2 of the light emitting device 10 and the second electrode 22 of the lead frame 20 to electrically connect the second pad P2 and the second electrode 22, and a light guide plate 50 formed on an optical path of the light emitting device 10. At least one first accommodating cup 21a capable of accommodating the first bonding medium B1 may be formed in the first electrode 21 of the lead frame 20, and at least one second accommodating cup 22a capable of accommodating the second bonding medium B2 may be formed in the second electrode 22 of the lead frame 20. At least one air discharge path 21b and at least one air discharge path 22b may be formed on the first and second accommodating cups 21a and 22a, respectively, to easily discharge air inside the first and second accommodating cups 21a and 22a to outside due to the first and second bonding media B1 and B2 pressed inside the first and second accommodating cups 21a and 22a when the light emitting device 10 is mounted on the lead frame 20.

Here, the light emitting device 10, the lead frame 20, the first bonding medium B1, the second bonding medium B2, the first and second accommodating cups 21a and 22a and the air discharge paths 21b, 21c, 22b, and 22c may have the same functions and configurations as those of the above-described light emitting device packages 100 and 200 illustrated in FIGS. 1 to 15. Thus, detailed descriptions thereof will be omitted.

The light guide plate 50 may be an optical member made of a light-transmitting material to guide light generated by the light emitting device 10.

The light guide plate 50 may be disposed on the path of the light generated by the light emitting device 10 and may transfer the light generated by the light emitting device 10 to wider areas.

The light guide plate 50 may be formed of a polycarbonate-based resin, a polysulfone-based resin, a polyacrylate-based resin, a polystyrene-based resin, a polyvinyl chloride-based resin, a polyvinyl alcohol-based resin, a polynorbornene-based resin, or a polyester-based resin. In addition, the light guide plate 50 may be formed of various light transmission resin materials. Also, a fine pattern, a fine protrusion, or a diffusion layer may be formed on a surface of the light guide plate 50, or microbubbles may be formed in the light guide plate 50.

Here, although not shown in FIG. 21, a diffusion sheet, a prism sheet, a filter, etc. may be additionally disposed above the light guide plate 50. Furthermore, various display panels such as a liquid crystal display (LCD) panel may be disposed above the light guide plate 50.

A lighting device (not shown) according to some embodiments of the present invention may include a light emitting device package. Here, elements of the light emitting device package of the lighting device according to some embodiments of the present invention may have the same functions and configurations as those of the above-described light emitting device packages 100 and 200. Thus, detailed descriptions thereof are not provided here.

FIGS. 16 to 20 are cross-sectional views showing sequential processes for manufacturing the light emitting device package 100 of FIG. 1 according to some embodiments of the present invention.

Figure 16:
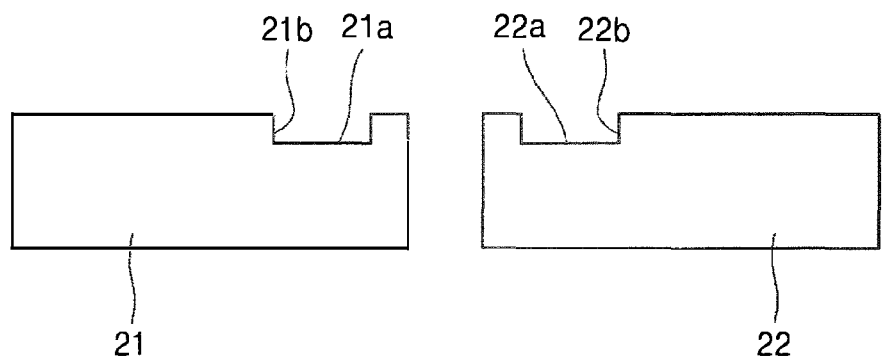
FIGS. 16 to 20 are cross-sectional views showing sequential processes for manufacturing the light emitting device package of FIG. 1 according to some embodiments of the present invention.

The processes for manufacturing the light emitting device package 100 according to some embodiments of the present invention will now be described with reference to FIGS. 16 to 20. Firstly, as illustrated in FIG. 16, the lead frame 20 including the first electrode 21 disposed at one side of the electrode separation space, the second electrode 22 disposed at the other side of the electrode separation space, the first accommodating cup 21a formed in the first electrode 21, the second accommodating cup 22a formed in the second electrode 22, and at least one air discharge path formed on each of the first and second accommodating cups 21a and 22a may be prepared.

Figure 17:
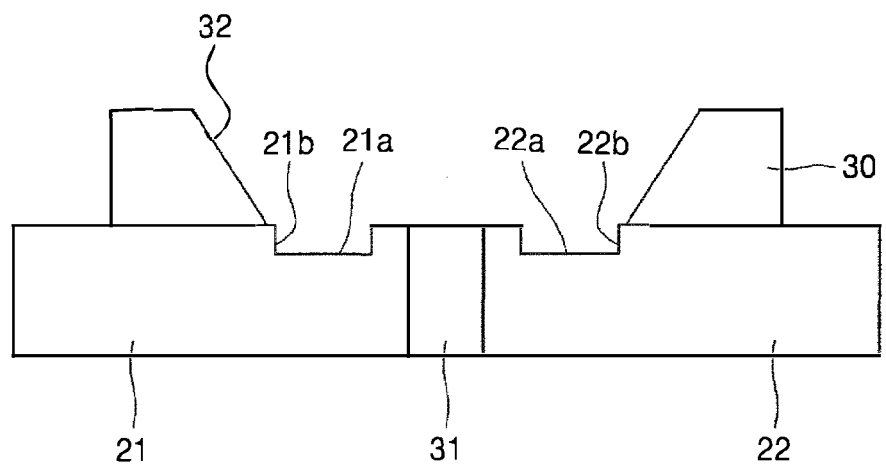

Then, as illustrated in FIG. 17, the electrode separation wall 31 of the reflective encapsulant 30 and the reflective cup 32 may be integrally molded.

Figure 18:
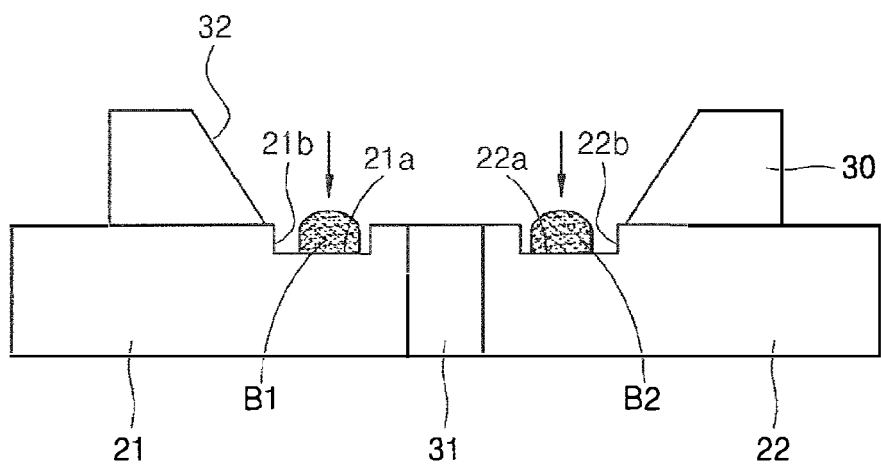

Subsequently, as illustrated in FIG. 18, solder paste or the like may be coated or dispensed as the first and second bonding media B1 and B2 on the first and second accommodating cups 21a and 22a using ultra-precision transfer, ultra-precision stamping, or various printing schemes such as inkjet printing, stencil printing and squeeze printing.

Figure 19:
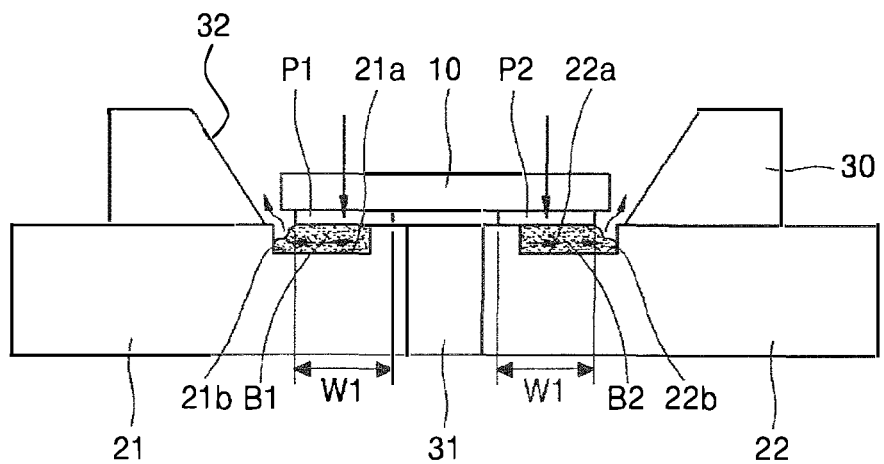

After that, as illustrated in FIG. 19, the light emitting device 10 may be mounted on the lead frame 20 in such a manner that a part of the first pad P1 directly contacts the first electrode 21, another part thereof is electrically connected to the first bonding medium B1, a part of the second pad P2 directly contacts the second electrode 22, and another part thereof is electrically connected to the second bonding medium B2, and air inside the first and second accommodating cups 21a and 22a may be discharged to outside using the air discharge paths 21b and 22b due to the first and second bonding media B1 and B2 pressed inside the first and second accommodating cups 21a and 22a.

Then, reflow soldering may be performed by heating the first and second bonding media B1 and B2 to harden the first and second bonding media B1 and B2.

Figure 22:
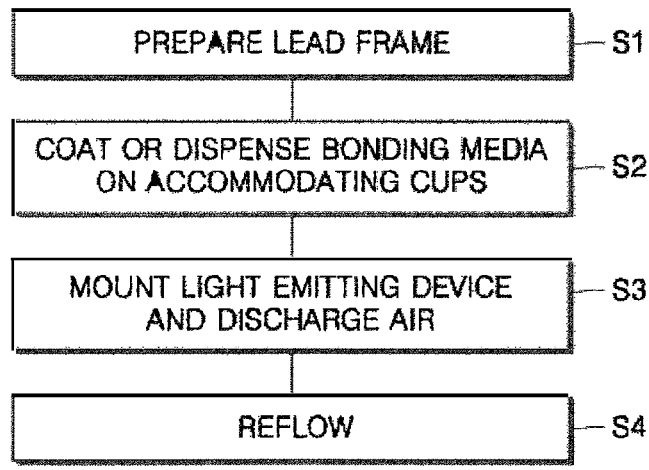
FIG. 22 is a flowchart of a manufacturing method of the light emitting device package of FIG. 1 according to some embodiments of the present invention.

FIG. 22 is a flowchart of a manufacturing method of the light emitting device package 100 of FIG. 1 according to some embodiments of the present invention.

As illustrated in FIGS. 1 to 22, the manufacturing method of the light emitting device package 100 according to some embodiments of the present invention may include (S1) preparing the lead frame 20 including the first electrode 21 formed at a side of the electrode separation space, the second electrode 22 formed at another side of the electrode separation space, the first accommodating cup 21a formed in the first electrode 21, the second accommodating cup 22a formed in the second electrode 22, at least one air discharge path 21b formed on the first accommodating cup 21a, and at least one air discharge path 22b formed on the second accommodating cup 22a, (S2) coating or dispensing the first bonding medium B1 on the first accommodating cup 21a and coating or dispensing the second bonding medium B2 on the second accommodating cup 22a, (S3) mounting the light emitting device 10 on the lead frame 20 and discharging air inside the first and second accommodating cups 21a and 22a to outside using the air discharge paths 21b and 22b due to the first and second bonding media B1 and B2 pressed inside the first and second accommodating cups 21a and 22a, and (S4) reflowing the first and second bonding media B1 and B2.

While the present invention has been particularly shown and described with reference to exemplary embodiments thereof, it will be understood by one of ordinary skill in the art that various changes in form and details may be made therein without departing from the spirit and scope of the present invention as defined by the following claims.

INDUSTRIAL APPLICABILITY

Physical and electrical bonding properties between components may be improved, the strength and durability of products may be increased, errors of the products may be prevented, and thus productivity may be greatly increased.

The invention claimed is:

1. A light emitting device package comprising:
a flip chip type light emitting device including a first pad and a second pad;
a lead frame where the light emitting device is mounted, the lead frame comprising a first electrode disposed at one side of an electrode separation space and a second electrode disposed at the other side of the electrode separation space;
a first bonding medium disposed between the first pad of the light emitting device and the first electrode of the lead frame to electrically connect the first pad to the first electrode; and
a second bonding medium disposed between the second pad of the light emitting device and the second electrode of the lead frame to electrically connect the second pad to the second electrode,
wherein at least one first accommodating cup capable of accommodating the first bonding medium is formed in the first electrode of the lead frame, at least one second accommodating cup capable of accommodating the second bonding medium is formed in the second electrode of the lead frame, the first pad directly contacts with an upper surface of the first electrode of the lead frame and an upper surface of the first bonding medium in the manner of the same plane, and the second pad directly contacts with an upper surface of the second electrode of the lead frame and an upper surface of the second bonding medium in the manner of the same plane.

2. The light emitting device package of claim 1, further comprising:
an electrode separation wall disposed between the first electrode of the lead frame and the second electrode of the lead frame.

3. The light emitting device package of claim 1, wherein the first bonding medium is disposed only within the first accommodating cup.

4. The light emitting device package of claim 1, wherein each of the first accommodating cup and the second accommodating cup is a rectangular recess having a rectangular cross section.

5. The light emitting device package of claim 1, further comprising an electrode separation wall disposed between the first electrode of the lead frame and the second electrode of the lead frame, and having the same width as a gap between the first pad and the second pad.

6. The light emitting device package of claim 1, wherein a contact region of the first electrode which the first pad contacts in, includes a plurality of individual areas which are separated from each other.

7. The light emitting device package of claim 1, wherein a contact region in the first electrode which the first pad contacts in, includes four individual areas which respectively correspond to four corners of the first accommodating cup.

8. The light emitting device package of claim 1, wherein a width of the first electrode of the lead frame and a width of the second electrode of the lead frame are greater than a width of an entrance of the first accommodating cup and a width of an entrance of the second accommodating cup, respectively.

9. The light emitting device package of claim 1, further comprising a reflective molding member having a reflective cup portion, the reflective cup portion being configured to surround side surfaces of the flip chip type light emitting device.

10. The light emitting device package of claim 9, further comprising an encapsulant filled in the reflective cup portion.

* * * * *